United States Patent [19]

Patel et al.

[11] Patent Number: 4,685,089
[45] Date of Patent: Aug. 4, 1987

[54] HIGH SPEED, LOW-POWER NIBBLE MODE CIRCUITRY FOR DYNAMIC MEMORY

[75] Inventors: Pravin P. Patel; Roger D. Norwood, both of Sugar Land, Tex.

[73] Assignee: Texas Instruments Incorporated, Dallas, Tex.

[21] Appl. No.: 645,579

[22] Filed: Aug. 29, 1984

[51] Int. Cl.⁴ ............................................. G11C 11/40
[52] U.S. Cl. .................................... 365/233; 365/189; 365/193
[58] Field of Search ............... 365/230, 233, 189, 193; 364/200, 900

[56] References Cited

U.S. PATENT DOCUMENTS 4,567,579  1/1986  Patel et al. ........................... 365/189

*Primary Examiner*—Terrell W. Fears
*Attorney, Agent, or Firm*—John G. Graham

[57] ABSTRACT

A semiconductor dynamic memory device has an array of one-transistor cells, with row and column decode to produce a 4-bit wide input or output from the array. Single-bit data-in and data-out terminals for the device are coupled to the 4-bit array input/output in a sequential mode. The row and column addresses are latched when $\overline{RAS}$ and $\overline{CAS}$ drop, and the latched address includes the address of the starting bit within the 4-bit sequence for serial I/O. The other three bits follow as $\overline{CAS}$ is cycled. This starting address is used to set a bit in a 4-bit ring counter, which is then used to cycle through the sequence. To reduce power dissipation, the inverter stages of the ring counter are operated by pulsed clocks generated from the asynchronous memory control clocks received from the CPU.

8 Claims, 10 Drawing Figures 4,685,089

HIGH SPEED, LOW-POWER NIBBLE MODE CIRCUITRY FOR DYNAMIC MEMORY

BACKGROUND OF THE INVENTION

This invention relates to semiconductor devices, and more particularly to memory devices of the dynamic read/write type having a nibble mode of operation.

One of the types of data input/output for a random access read/write memory is the so-called nibble mode in which data is accessed in a four-bit sequence. The four bits are read or written sequentially through single-bit data terminals. Semiconductor dynamic MOS RAMs of the 64K, 256K or 1-Megabit size may be constructed in this manner, for example. A dynamic RAM circuit particularly suitable for this mode of operation is disclosed in U.S. Pat. No. 4,239,993, where four pairs of dual-rail I/O lines are brought out from the cell array in parallel, so four bits are accessed at one time. However, the starting address for the first bit does not necessarily fall on the same boundries as those used for the array I/O lines. The nibble mode circuitry must allow the starting address to be any column, not just every fourth column. A method of accomplishing this type of nibble mode access was described in U. S. patent application Ser. No. 512,076, filed July 8, 1983, by Patel & Reddy, assigned to Texas Instruments.

It is the principal object of this invention to provide improved high-speed, low-power input/output circuitry for semiconductor memory devices, particularly for nibble mode operation. Another object is to provide improved nibble mode circuitry for DRAMs which permits fast access beginning at any column address, yet consumes a minimum of power.

SUMMARY OF THE INVENTION

In accordance with one embodiment of the invention, a semiconductor dynamic memory device has an array of one-transistor cells, with row and column decode to produce a 4-bit wide input or output from the array. Single-bit data-in and data-out terminals for the device are coupled to the 4-bit array input/output in a sequential mode. The row and column addresses are latched when $\overline{RAS}$ and $\overline{CAS}$ drop, and the latched address includes the address of the starting bit within the 4-bit sequence for serial I/O. The other three bits follow as $\overline{CAS}$ is cycled. This starting address is used to set a bit in a 4-bit ring counter, which is then used to cycle through the sequence. To reduce power dissipation, the inverter stages of the ring counter are operated by pulsed clocks generated from the asynchronous memory control clocks received from the CPU.

Although described herein using a four-bit nibble as an example, the circuitry and features of the invention can be used for a serial byte mode (8-bits), or any other number as may be appropriate.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, in which:

DETAILED DESCRIPTION OF SPECIFIC EMBODIMENT

Figure 1:
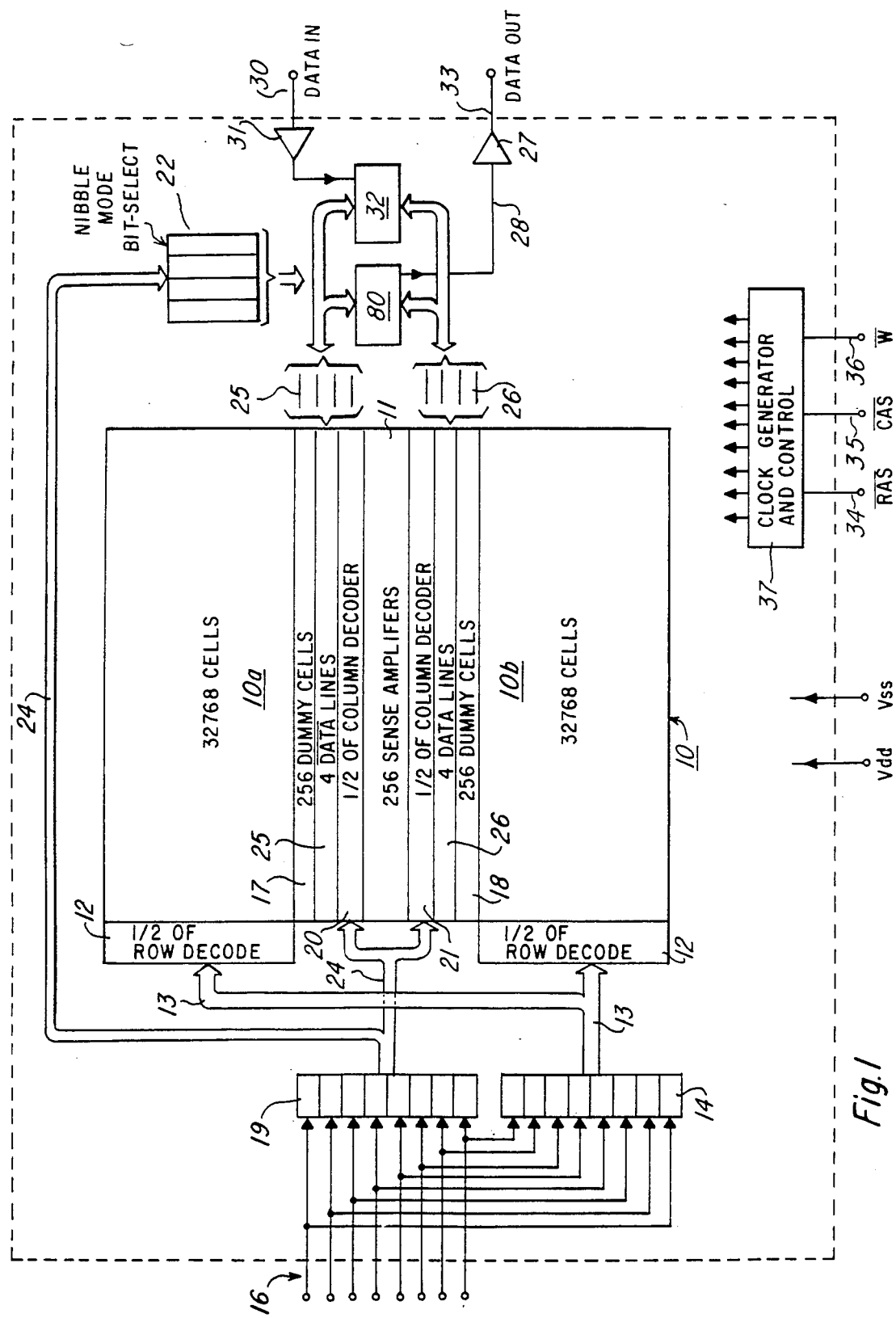
FIG. 1 is an electrical diagram in block form of a semiconductor dynamic memory device which may use the low-power nibble mode circuitry of the invention.

Referring to FIG. 1, a memory device which may utilize features of the nibble mode circuitry of invention is illustrated in block diagram form. This is a semiconductor read/write memory of the dynamic type, typically made by an N-channel, self-aligned, silicon gate, MOS process. All of the memory device of FIG. 1 is included in one silicon chip of perhaps about 30,000 to 50,000 square mils in size, which usually would be mounted in a standard dual-in-line package having sixteen or eighteen pins or terminals. A 64K×1 version of this type of device is now commercially available under the part number TMS41643, and a 16K×4 version under part number TMS4416. Of course, the features of the invention may be used in 256K or 1-Megabit dynamic RAMs. However, in the example of FIG. 1, the device includes an array 10 of 65,536 memory cells, with the array split into two halves 10a and 10b of 32,768 cells each, in a regular pattern of 256 rows and 256 columns. Of the 256 row or X lines, there are 128 in the array half 10a and 128 in the half 10b. The 256 sense amplifiers 11 in the center of the array; these are differential type bistable circuits made according to the invention disclosed and claimed in U.S. Pat. No. 4,239,993 issued to McAlexander, White and Rao, assigned to Texas Instruments. Each sense amplifier is connected in the center of a column line, so 128 memory cells are connected to each side of each sense amplifier by a column line half. The chip requires only a single +5V Vdd supply, along with a ground terminal Vss.

A row or X address decocer 12, split into two halves, receives sixteen A and $\overline{A}$ lines 13 from eight address buffers or latches 14. An eight-bit X address at TTL voltage levels is applied to inputs of the address buffers 14 by eight address input terminals 16. The X decoder 12 functions to select one of the 256 row lines as defined by an eight bit address on the input terminals 16; if the selected row line is in the half 10b of the cell array then a row of dummy cells 17 on the opposite side of the sense amplifiers 11 is also activated, while if a line in the half 10a is selected then a row of dummy cells 17 on the opposite side of the sense amplifiers 11 is also activated, while if a line in the half 10a is selected then a row of dummy cells 18 is activated. The address signals on the input lines 16 are multiplexed; the Y or column address is also applied to these input lines 16 and is latched into a set of eight column address buffers 19, from which the address is applied to 1-of-64 column decoders 20 and 21, and also to 1-to-4 nibble-mode bit-selector circuitry 22, via lines 24. The four-of-256 selection made by the column decoders 20 and 21, connects one group of four columns in the array to sets of four data and data bar lines 25 and 26, based on six bits of the eight bit column address. For a nibble mode read operation, the bit-selector circuitry 22 selects one pair of the four pairs of dual-rail lines 25 and 26 (based on two address bits and complements on lines 24 from the eight bit column address) and connects the selected pair to a data output buffer 27 via lines 28, and then connects the other three pairs to the output in sequence. A single-bit data input is applied by an input terminal 30 to a data input buffer 31, and the output of this buffer is coupled to the input circuitry 32 as will be explained. The buffer 31 may be of the same general circuit design as the address buffer circuits 14 and 19, which is a circuit as shown in U.S. Pat. No. 4,280,070, assigned to Texas Instruments. Data output is connected from the data output buffer 27 to a single data-out terminal 33.

Figure 2:
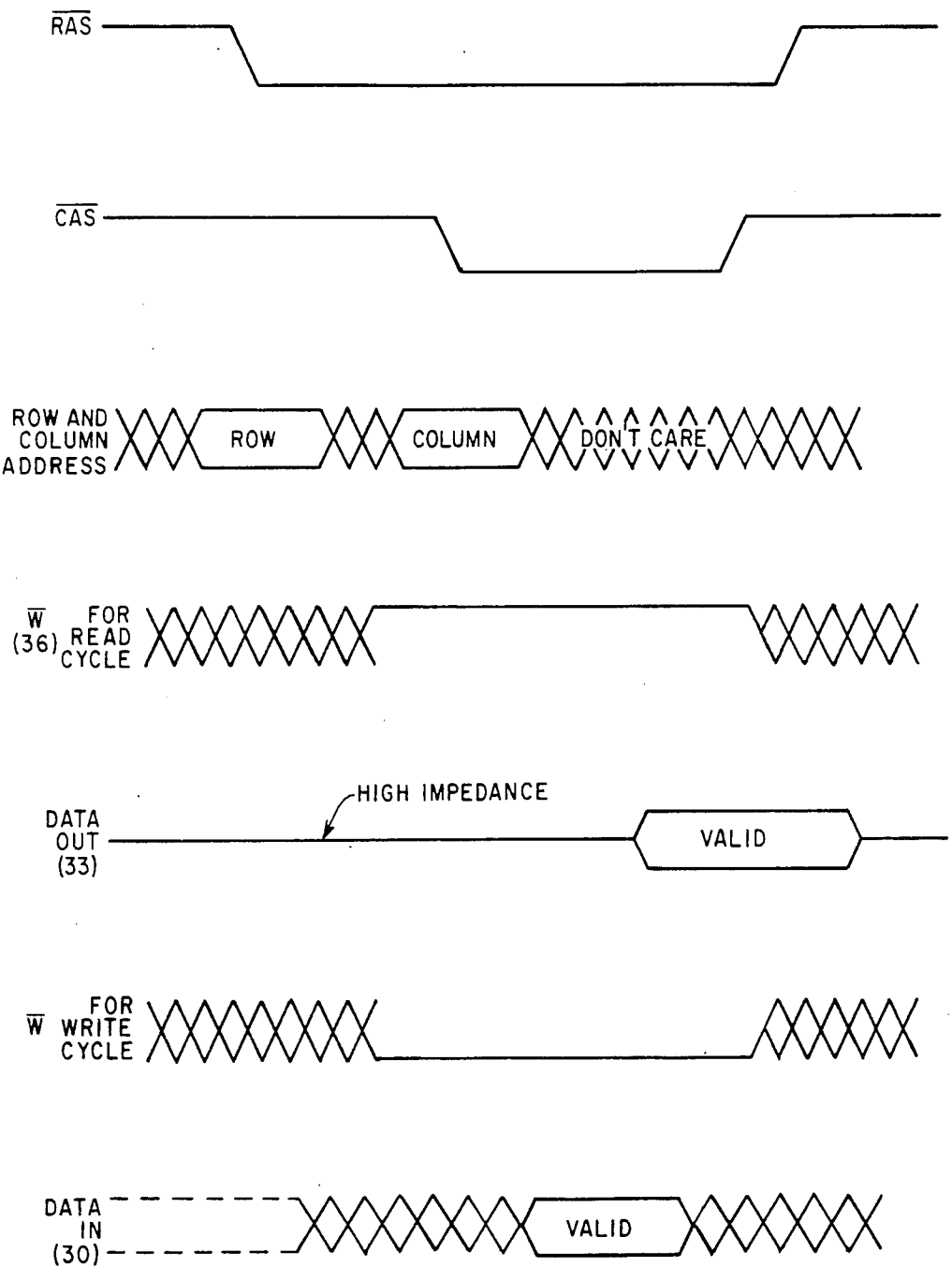
FIGS. 2, 2a, 2b and 2c are graphic representations of voltage vs. time, or other conditions vs. time, existing for various parts of the device of FIG. 1.

The various operating modes are represented in FIGS. 2, 2a, 2b, and 2c. The X address strobe signal, referred to as $\overline{RAS}$, is applied to an input 34. Likewise, the Y address must appear during a column address strobe signal $\overline{CAS}$ on an input 35. A read/write control $\overline{W}$ on an input 36 is the other control signal. These three inputs are the controls and also the basic timing clocks of the system, and are applied to clock generator and control circuitry 37 which generates a large number of clocks and control signals as discussed below to define the operation of various parts of the device. For example, in the single bit mode, when $\overline{RAS}$ goes low as seen in FIG. 2, clocks derived from $\overline{RAS}$ cause the buffers 14 to accept and latch the eight TTL level bits then appearing on the input lines 16. When $\overline{CAS}$ goes low then clocks generated in the circuitry 37 cause the buffers 19 to latch the TTL level Y address signals on the inputs 16. The row and column addresses must be valid during the time periods shown in FIG. 2, for a single-bit read cycle, and the $\overline{W}$ signal on input 36 must be high during the period illustrated; the output on the terminal 33 will be valid during the time seen at the end of a read cycle. For a single-bit write-only cycle, the $\overline{W}$ signal must be low and the data-in bit must be valid during the time seen in FIG. 2. The data out pin stays in a high impedence state during a write-only cycle. A single-bit read/write or read-modify-write cycle is implemented when $\overline{W}$ drops after $\overline{CAS}$ falls but before $\overline{RAS}$ and $\overline{CAS}$ go high.

Figure 2A:
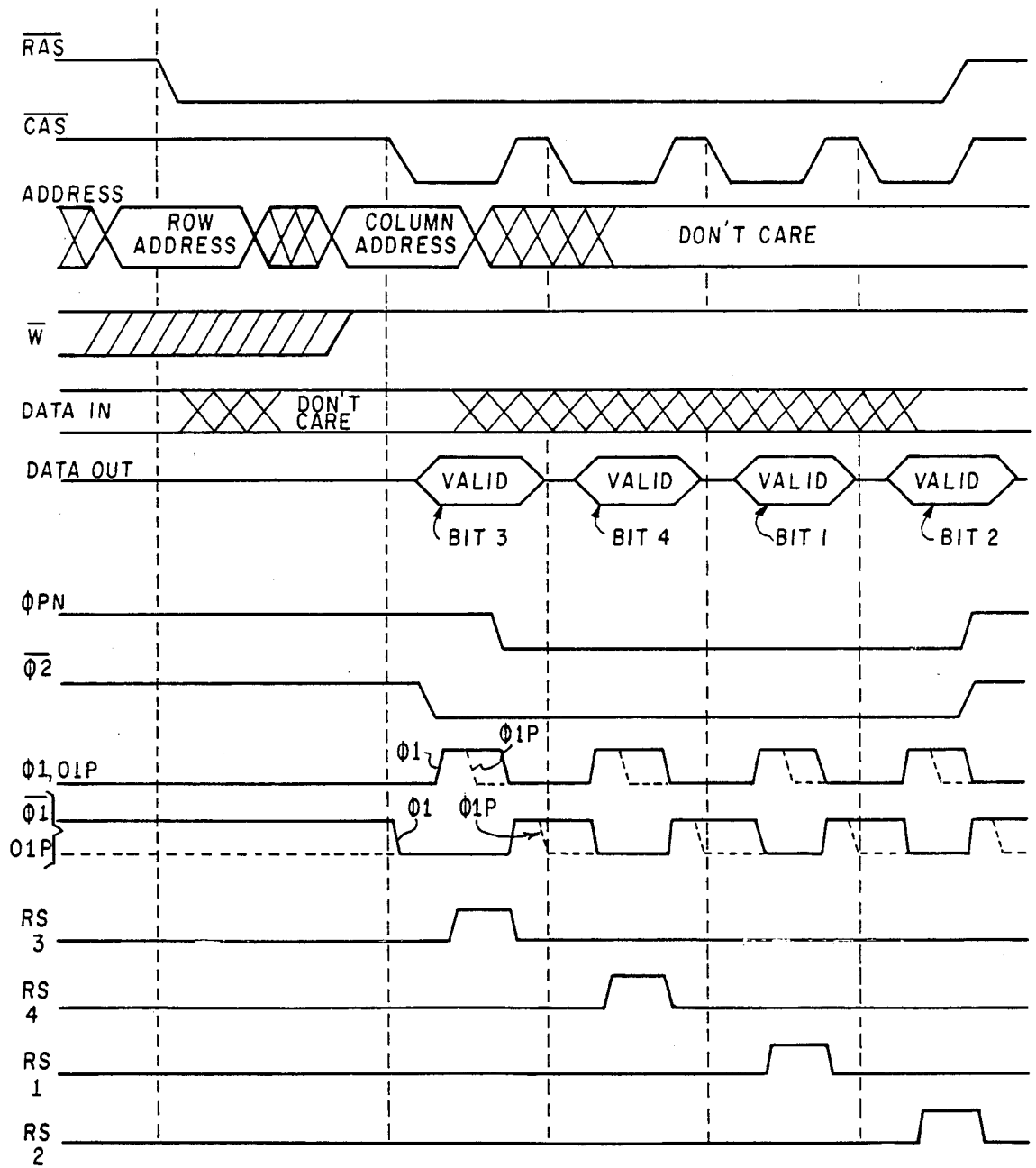
Figure 2B:
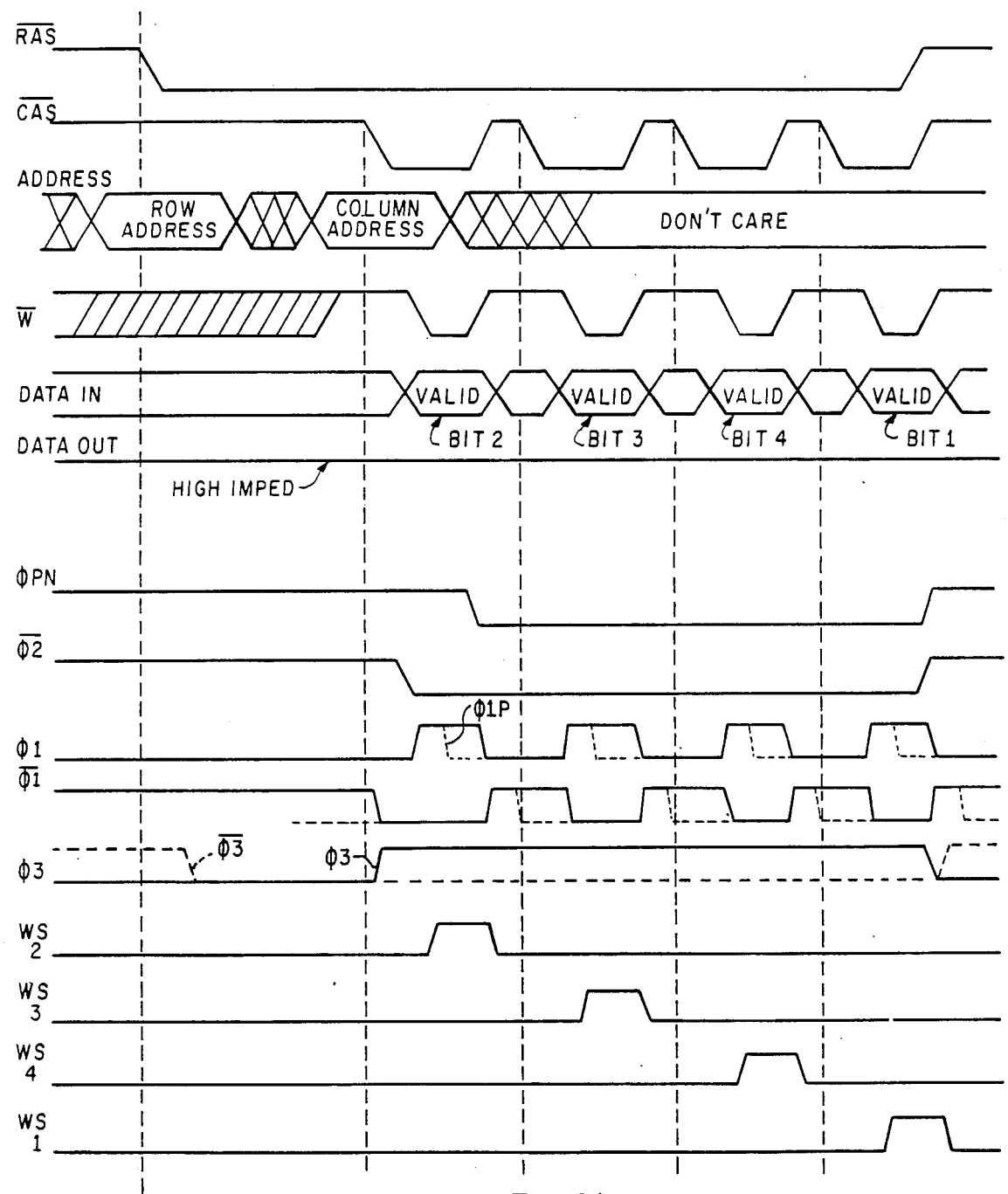
Figure 2C:
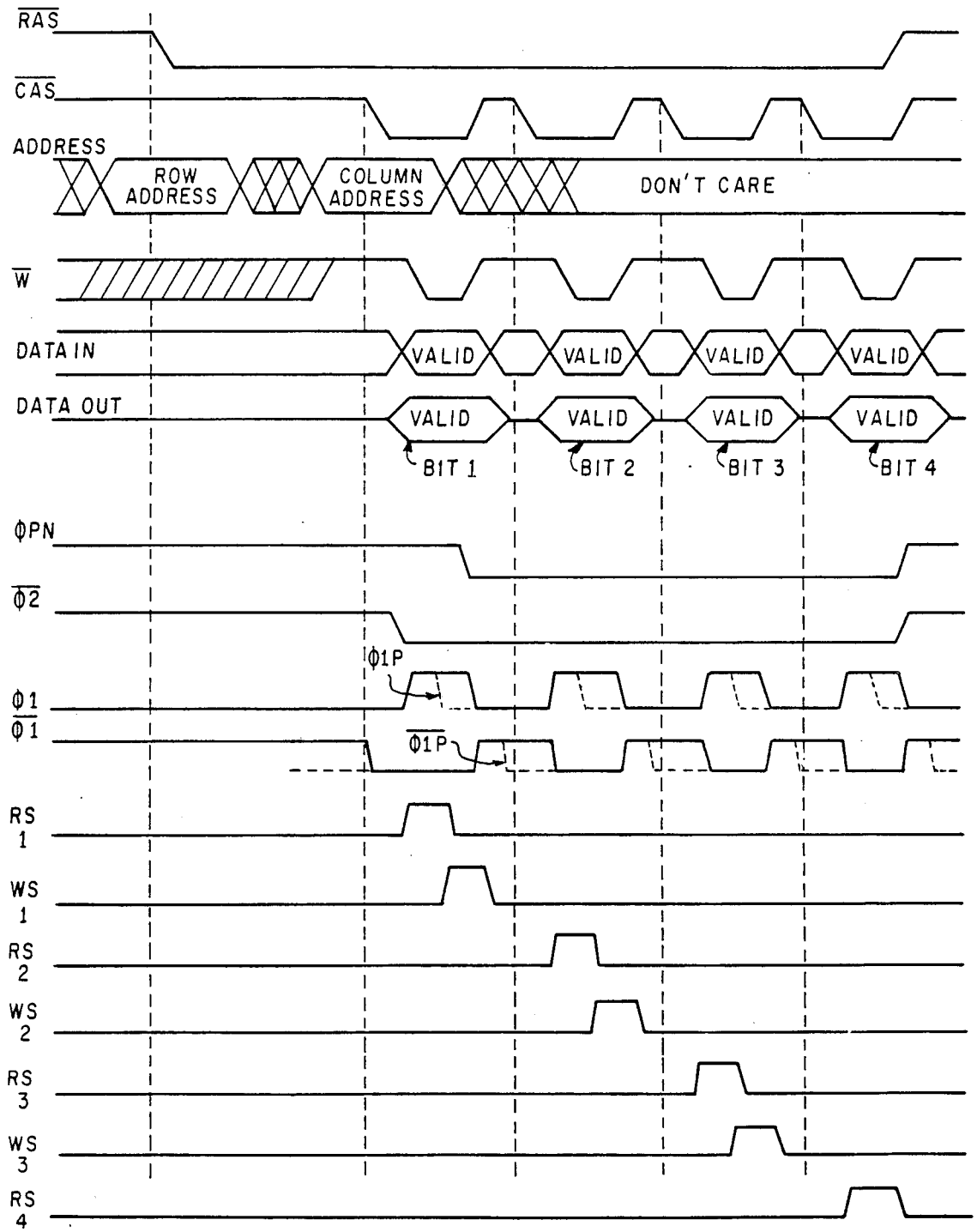

FIGS. 2a, 2b and 2c show the timing diagrams for 4-bit read cycle, write cycle, and read-modify-write cycle, respectively, in the nibble mode. For a nibble-mode operation, $\overline{RAS}$ stays low and the $\overline{CAS}$ is cycled to select one, two, three or four bits for read or write. Thus, the $\overline{W}$ input may be cycled while $\overline{RAS}$ stays down to produce an operation whereby any of the four bits of the nibble are both read out and written into.

Figure 3:
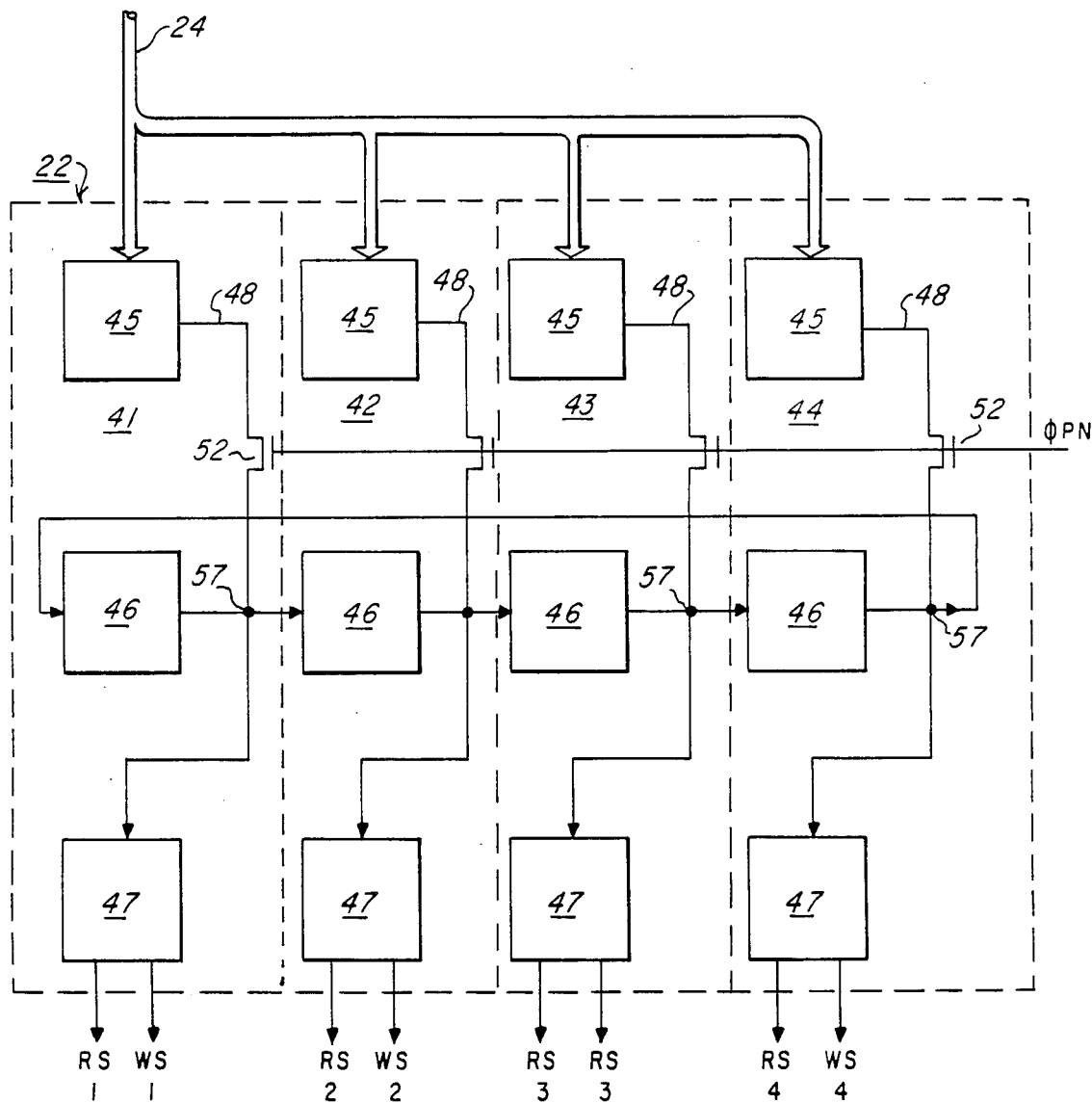
FIG. 3 is an electrical diagram in block form of the nibble mode circuitry in the device of FIG. 1.

Referring to FIG. 3, the nibble mode circuitry 22 consists of four identical circuit blocks 41, 42, 43, 44, with each block containing a decoder 45, a shift register stage 46, and a latch 47. Each decoder 45 receives a unique combination of the two address bits or complements on the lines 24 to produce an output on only one of the four lines 48 to select one-of-four of the nibble circuit blocks 41-44 as the starting address. The four shift register stages 46 circulate a bit to mark which of the four data bits is to be used in the three cycles following the first active cycle. The latches 47 hold the control information for which bit and whether read or write.

Figure 4:
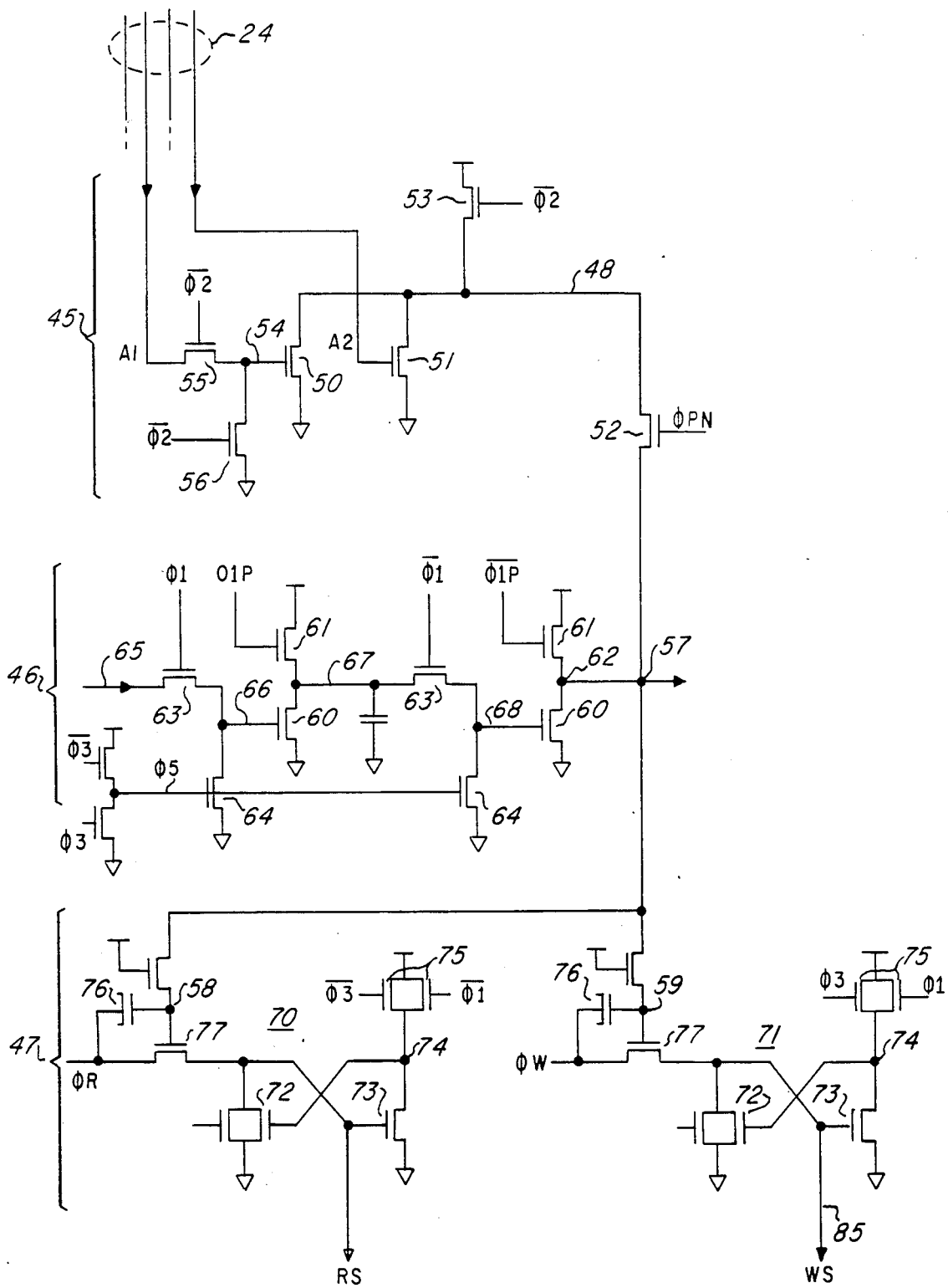
FIG. 4 is an electrical schematic diagram of one of the four nibble circuit blocks of FIG. 3, using the low-power shift register stages of the invention.

In FIG. 4, the circuitry of one block (i.e., decoder 45, shift register stage 46 and latches 47) is shown in detail.

The decoder 45 is a NOR gate of conventional form containing input transistors 50 and 51 receiving the address bits or complements A1 and A2, with output node 48 precharged on $\phi 2$ by transistor 53. Input node 54 has the address bit clocked in on $\overline{\phi 2}$ by transistor 55, and predischarged on $\overline{\phi 2}$ by transistor 56. When $\phi 2$ goes low, $\overline{\phi 2}$ goes high, and the output node 48 conditionally discharges, depending upon the address. These clocks are shown in FIG. 2a for read, or FIG. 2b for write. The node 48 is connected through a transistor 52 to the output node 57 of the shift register stage 46, and also to nodes 58 and 59 in the latch 47 (via isolating transistors having Vdd on their gates).

All three unselected decoding nodes 48 will be discharged to ground by the valid address signal lines 24 during the first active memory cycle. The decoding node 48 of the selected decoder 45 will remain high. Also nodes 57, 58 and 59 are precharged high by transistor 53 through node 48 and transfer gate 52. So, during the first active memory cycle the nodes 57, 58 and 59 of the one selected one of the nibble circuit blocks 41-44 will remain high but the corresponding nodes of the three unselected nibble circuit blocks 41-44 will be discharged to ground through their transfer gates 52 and transistors 50, 51. Once this selection process is completed during the first active memory cycle the clock $\phi pn$ goes low at the end of this first cycle, thus isolating the decoder 45 from the rest of the nibble circuit of FIG. 4. During nibble cycles followed by regular memory cycles, all decoders 45 remain disconnected from the rest of the nibble circuitry.

The improved shift register stage 46 of FIG. 4 is a dynamic circuit to provide low power, yet high speed, i.e. minimum nibble cycle time. This stage is basically two inverters connected in series, each containing a driver transistor 60, load transistor 61, an output node 62, and a clocked transfer transistor 63. The transfer transistor 63 for the first stage is clocked by $\phi 1$ and the transfer transistor 63 for the second by $\overline{\phi 1}$, seen in FIGS. 2a-2c. The gates of the driver transistors 60 are each predischarged by a separate transistor 64 which has a control $\phi s$ on its gate. Output node 62 of the second inverter in a shift register stage 46 is connected via node 57 to input node 65 of the first inverter of the next shift register stages and the output node 57 of the last shift register stage is connected back to the input node 65 of the first one. During an active period $\phi 1$ goes high, which allows node 66 to be at the same potential as output node 57 of the previous stage, i.e., a forward shift when $\phi 1$ goes high, storing an inverted bit on output 67 of each first inverter. At the end of the active cycle $\phi 1$ goes low but the information transferred to gate 66 and output 67 will remain valid. After $\phi 1$ goes to zero, at the beginning of the precharge cycle $\overline{\phi 1}$ goes high, transferring charge via transistor 63 from output 67 to gate 68 of the second inverter, and so the complement of the bit stored on output 67 will become valid at output node 62. As two inversions occur since the previous active cycle, each output node 57 will be at the status of the output node 57 of the preceeding stage, thus information is shifted through the shift register stages during each nibble cycle (defined by $\phi 1$ and $\overline{\phi 1}$ cycling high and low). This arrangement allows the CPU which is accessing the memory to read or modify data in the four nibble bits at will. The circuit is constructed so that the capacitances of nodes 65 and 67 are about eight times the capacitances of the gates 66 and 68 so that when charge transfer occurs, gates 66 and 68 reach a reasonable potential. Also transistors 61 and 60 in each stage are ratioed to get reasonable zero levels on nodes 62. $\phi1$ and $\overline{\phi1}$ are mutually exclusive clocks as seen in FIGS. 2a–2c. Transistors 64 are employed to keep gates 66 and 68 at ground potential during the initial portion of the first active memory cycle; these transistors 64 have a control $\phi$s on their gates. This control is generated from $\phi3$ and $\overline{\phi3}$, and these in turn are generated from $\overline{RAS}$ dropping and the first $\overline{CAS}$, as seen in FIG. 2b, for example. Thus all stages 46 are zeroed to begin an active cycle, and the decoded address bits A1, A2 select one of the four to receive a "1" on its node 57, then this bit is circulated in the shift register stages by $\phi1$ and $\overline{\phi1}$.

According to the invention, the load transistors 61 of the shift register inverters receive short pulsed clocks $\phi1p$ and $\overline{\phi1p}$, instead of the full clocks $\phi1$ and $\overline{\phi1}$ as was the case in the circuit of application Ser. No. 512,076 mentioned above. The pulse widths of the clocks $\phi1$ and $\overline{\phi1}$ are dependent upon the asynchronous timing of $\overline{CAS}$, which is under control of the CPU. The $\overline{CAS}$ may be toggled at a wide time spacing (so long as $\overline{RAS}$ stays down), and still be within the specified operating limits. Of the eight inverters in the four shift register stages 46, four would be on all the time, with current flow through transistors 60 and 61, wasting a considerable amount of power. To avoid this unnecessary power dissipation the pulsed clocks $\phi1p$ and $\overline{\phi1p}$ are used, and these clocks are very short in duration, perhaps five to ten nanoseconds, just enough to charge the capacitances of nodes 67 and 57. The capacitances of these nodes are constructed by circuit layout to be large enough to sustain a 1-level voltage for at least ten microseconds to be within the specification. The node 57 inherently has an adequate capacitance but the node 67 is supplemented with a capacitor 69 of about one square mil.

The falling edges of the clocks $\phi1$ and $\overline{\phi1}$ on the gates of transistors 63 will have a fall-time which is dependent upon the rising and falling edges of $\overline{CAS}$ (and $\overline{RAS}$ for the last cycle). Since these edges of $\overline{CAS}$ can be quite slow, the pulse clocks $\phi1p$ and $\overline{\phi1p}$ are generated with much sharper rise-time and fall-time. The pulse width of the clocks $\phi1p$ and $\overline{\phi1p}$ is fixed, perhaps five ns., so only a fixed amount of power is dissipated in each inverter. For example, each inverter that is on may dissipate 8 milliwatts for 12ns., or it draws 1.6 mA (peak) for about 12 ns., which is only 0.58 mA for all four inverters for a 260 ns memory cycle. Four inverters fire during an active cycle and four fire during a nibble precharge cycle.

Each one of the latch circuits 47 contains a read latch 70 and a write latch 71. The latches consist of cross-coupled transistors 72 and 73, with nodes 74 precharged high on $\overline{\phi1}$ and $\phi3$ by transistors 75, leaving nodes RS and WS at ground to begin a cycle since a high on nodes 74 turns on transistors 72. During an active memory cycle the nodes 58 and 59 of the selected one of the nibble blocks 41–44 will be high and the corresponding nodes 58, 59 in these latches 47 of the other three nibble blocks will be at zero level. Depending upon whether the current operation is a read, write or read-modify-write cycle, the signals $\phi R$ or $\phi W$ or both, are generated by the control circuitry 37 of FIG. 1. Nodes 58 and 59 are booted through capacitors 76 to attain efficient charge transfer through devices 77 for the one selected bit; in the unselected bits the transistor 77 is held off. The latches 70 and 71 are primarily used to keep the unselected RS and WS controls at zero potential. Without these latches the unselected RS and WS controls would be at floating-zero level and any bump on these signals due to noise would interfere with the normal read, write or read-modify-write cycle.

Figure 5:
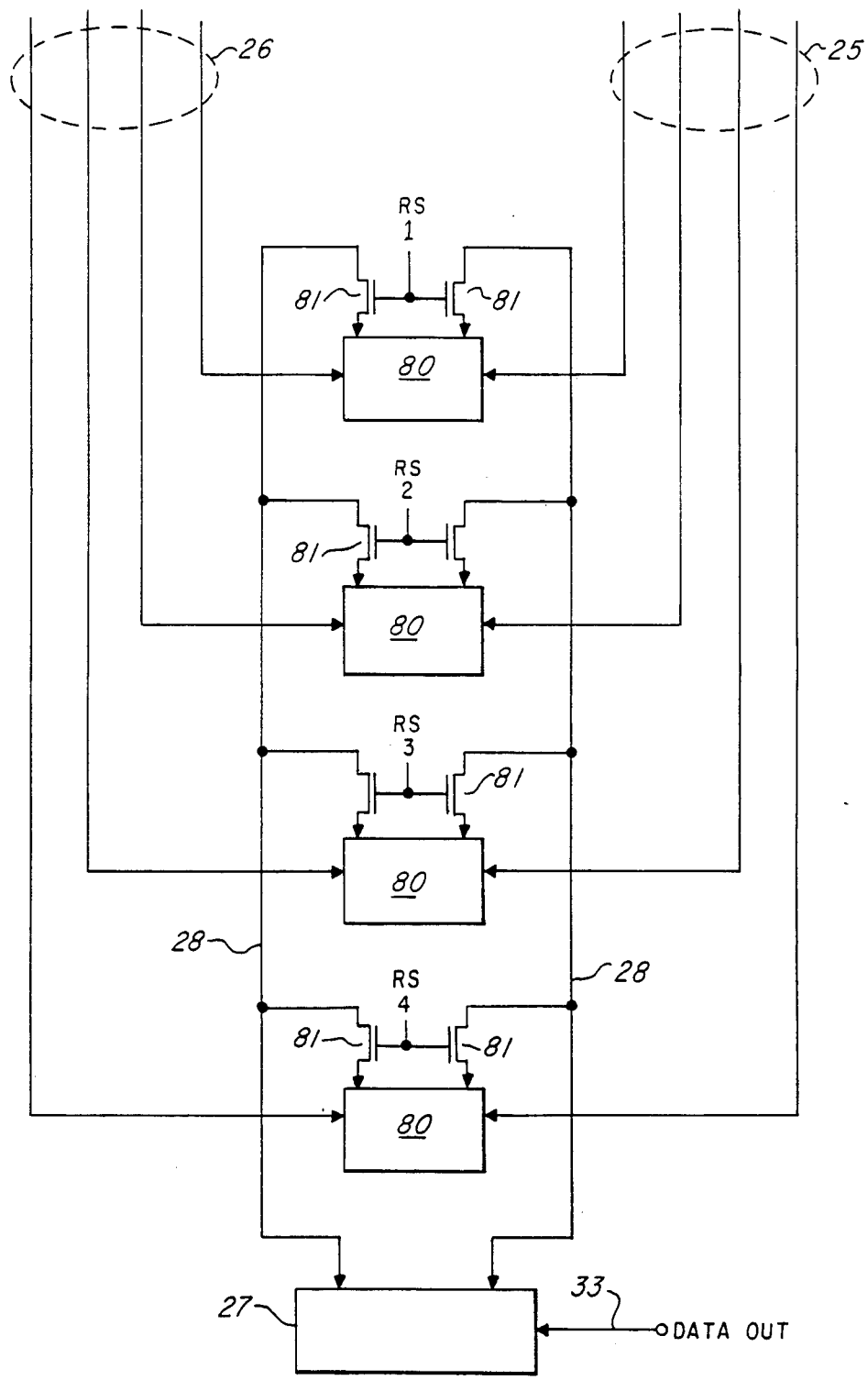
FIG. 5 is an electrical diagram in block form of the data output circuitry of FIG. 1.

All of the four RS signals from FIG. 4 are connected to intermediate sense amplifiers 80 as shown in FIG. 5; these four RS signals from the latches 47 control the gates of transfer devices 81, which connect one of the intermediate output amplifiers 80 to the common output buffer 27 by dual-rail lines 28. Thus the selected RS signal will connect the corresponding intermediate buffer 80 to the output buffer 27; and so the output data which was stored in that intermediate output buffer when the array output on lines 25 and 26 came valid is transferred to data output buffer 27. All four of the dual-rail bits of the selected nibble on lines 25, 26 from the memory array 10 are read concurrently during the first active memory cycle and stored in their corresponding intermediate output buffers 80, to be subsequently read out via transfer devices 81 if the nibble mode is used; if a single bit operation is being implemented (i.e., $\overline{CAS}$ does not cycle high then low with $\overline{RAS}$ staying down), then only one of these four bits is sent to the output pin 33.

Figure 6:
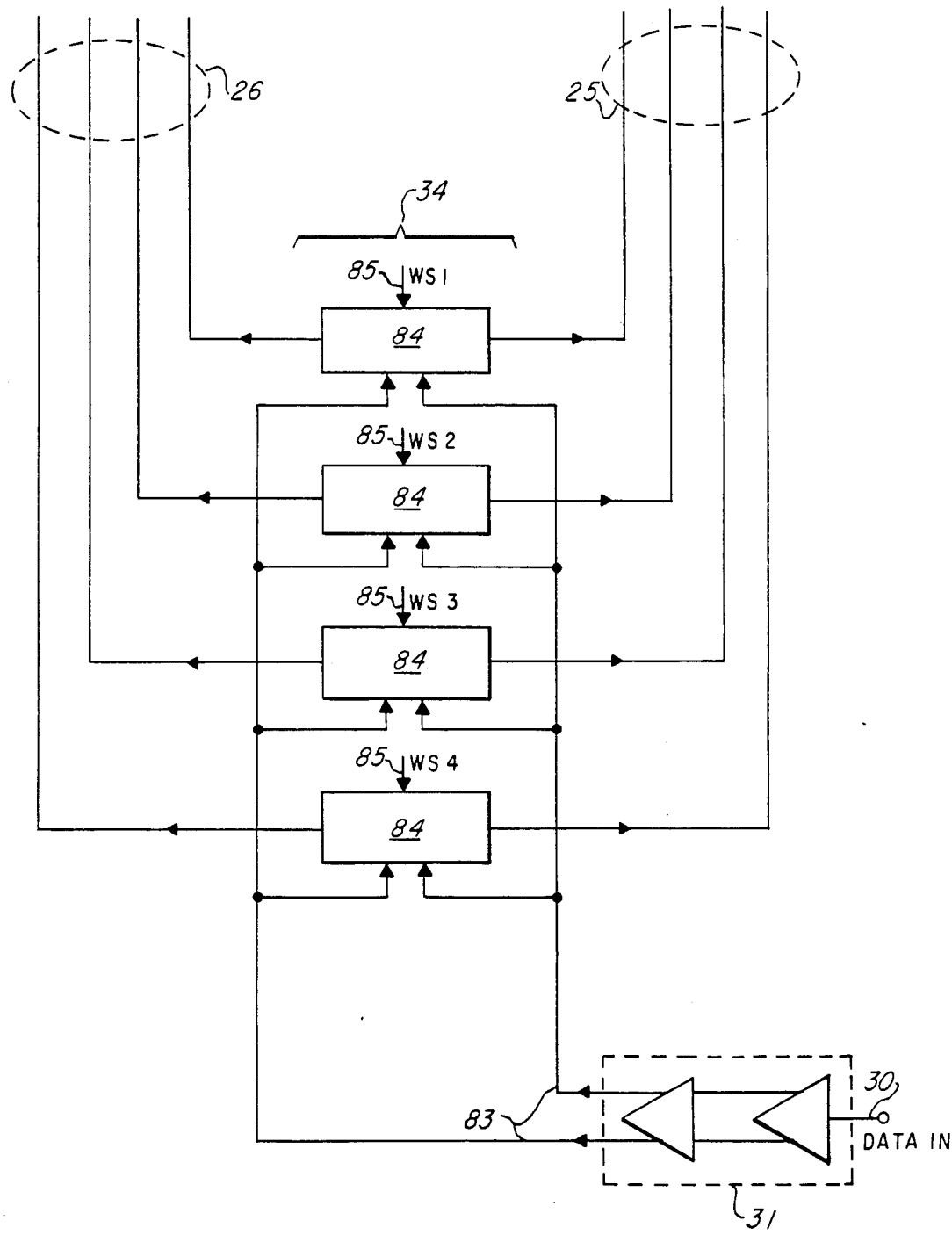
FIG. 6 is an electrical diagram in block form of the data input circuitry of FIG. 1.

Referring now to FIG. 6, the data input circuitry comprises an input buffer 31 which receives the data bit on pin 30, and produces amplified dual-rail data on lines 83. These lines are connected to four identical buffers 84 which produce dual-rail data outputs to the four sets of I/O lines 25 and 26 going to the array. Each one of these circuits also receives one of the four write signals WS on lines 85 from the four write latches 71 of FIG. 4 (latches 47 of FIG. 3), so only one of these circuits 84 is selected at a given instant. In nibble mode, the WS inputs 85 will cycle in some order such as 2-3-4-1, or 4-1-2-3, etc., as the data bits to be written into the array will appear on the pin 30.

Figure 7:
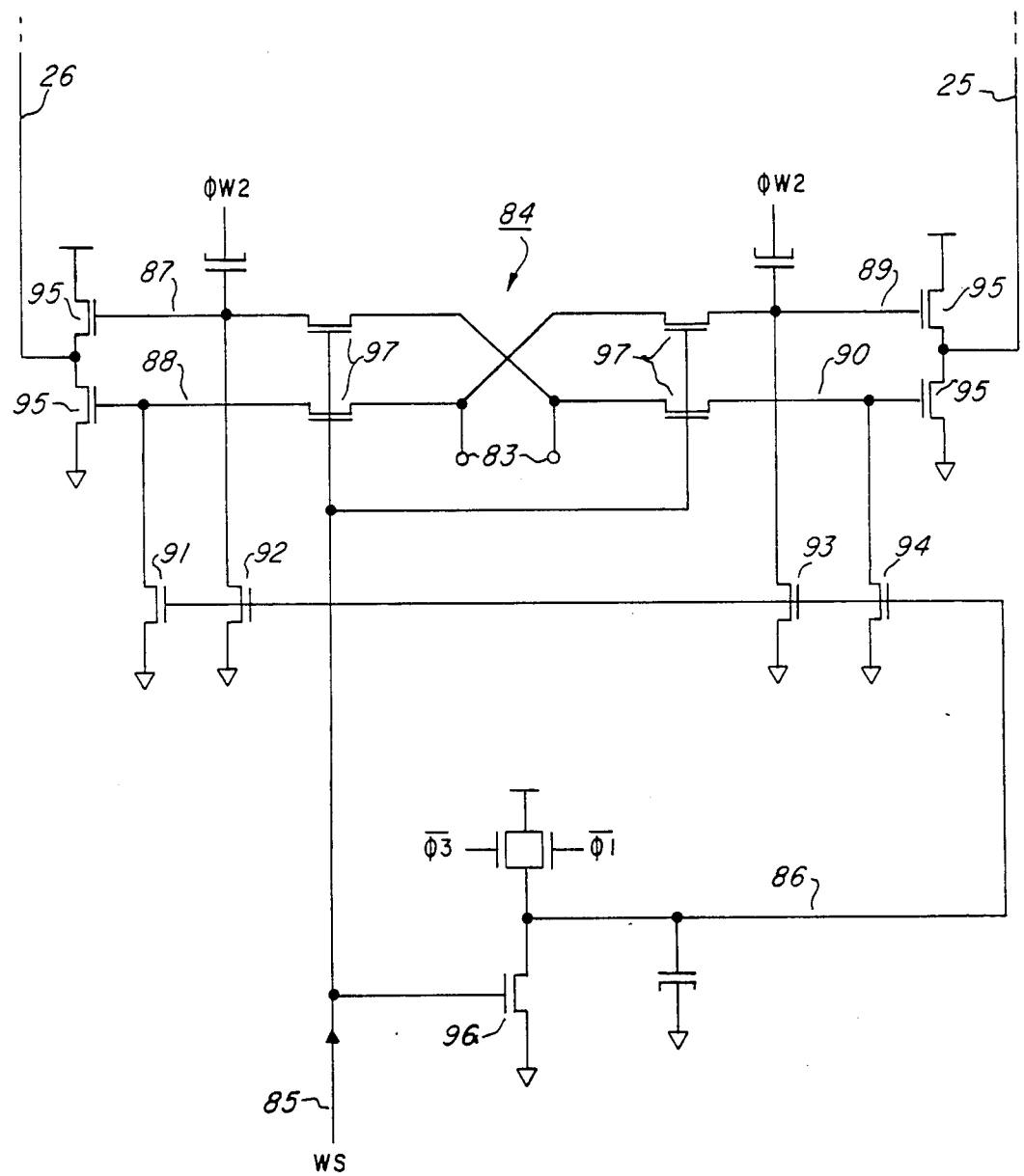
FIG. 7 is an electrical diagram of one of the four data input buffers of FIG. 6.

In FIG. 7, one of the input buffer circuits 84 is shown in detail. During a write cycle (FIG. 2b) the selected WS output 85 from the latches 71 will go high and will discharge node 86. This node 86 had been precharged by $\overline{\phi3}$ (FIG. 2b), then charged each nibble cycle by $\overline{\phi1}$. Discharging of node 86 releases nodes 87,88,89 and 90 from being clamped to ground; when the nodes 86 in each circuit 84 is precharged high, transistors 91,92,93 and 94 are held on and nodes 87,88,89 and 90 held low, so that the I/O lines 25,26 can be precharged high through circuitry not shown. All four nodes 86 remain high during a read operation to avoid any bus conflict; the large output transistors 95 of these data-in buffers 84 remain off, providing a high impendence output to the I/O lines 25,26.

During a write operation the dual-rail data on input lines 83 is valid before one of four WS signals on lines 85 goes high. The selected write signal WS will (a) turn on transistor 96 discharging node 86, (b) release nodes 87,88,89,90 and (c) turn on transistors 97 to charge certain of the nodes 87–90 to proper values from the dual-rail data inputs 83. A clock $\phi W2$ occurring just after $\phi W$ pumps up the nodes 87 and 89 to assure a high level on the selected one-going I/O lines.

This write multiplexing scheme improves the write timing without wasting layout area because the two-stage high-level buffer 31 can be common to all four data input stages 84. Also, all four of the critical nodes 87–90 are kept at a solid zero level by devices 91–94 which functions to avoid any bus conflict due to noise at the gate areas of the large devices 95.

A fast nibble cycle is achieved by disconnecting the decoders 45 from the shift registers 46 after the first active memory cycle by transfer devices 52 and clock φPN. During following nibble cycles the selector information is transferred through the fast shift register stages 46. During nibble cycles after the initial capture of the starting bit address, the address signals 24 are not needed to select the next one of the four nibble circuit blocks 41-44.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor memory device having an array of rows and columns of memory cells, and column lines coupled to said columns of cells, the column lines being in groups, and addressing means for selecting rows and columns based upon input addresses, comprising:

a plurality of output lines extending to all of said groups of columns to simultaneously provide a plurality of bits of data from memory cells selected by the input address, sequential output selection means receiving certain bits of said input address to select one of said plurality of output lines as a beginning output bit and to sequence through the remaining output lines for producing output bits therefrom, said selection means including decoder means responsive to said certain bits of the address input, shift register means for circulating a bit from a starting point determined by said decoder means, and control latch means to temporarily hold outputs of the decoder means and shift register means, a plurality of output data latches each coupled to one of said plurality of output lines and holding said output bits, means for coupling said output bits from said output data latches to a single output terminal in a sequence controlled by the contents of said control latch means, wherein said shift register means includes a plurality of stages having inverters, and each inverter has a clocked load and a clocked transfer gate, and means for clocking the transfer gates of the inverters using shift dock voltage pulses at a repetition rate based on a memory control input to the device, and for clocking the loads with a fixed-length clock derived from said memory control input and having a dwell time significantly less than the dwell time of said shift clock voltage pulses.

2. A device according to claim 1 wherein said memory cells are one-transistor dynamic cells; wherein said address input is multiplexed into said device in response to row address strobe signal $\overline{RAS}$ and a column address strobe signal $\overline{CAS}$; and said memory control input is said column address strobe $\overline{CAS}$.

3. A device according to claim 2 wherein said shift register means advances a bit in response to high and low cycling of said column address strobe signal $\overline{CAS}$.

4. A device according to claim 3 wherein said means for coupling sequentially applies said bits of data to said output terminal under control of said high and low cycling of said column address strobe signal $\overline{CAS}$.

5. A device according to claim 4 wherein said output lines include 4 sets of dual-rail data lines.

6. A device according to claim 1 including a plurality of data input circuits receiving data from a single data-in terminal in a sequential order determined by said control latch means, and means coupling data simultaneously from said data input circuits via said plurality of output lines to said columns.

7. A device according to claim 1 including means to zero said shift register means at the beginning of an active cycle, and for thereafter inserting a bit in said shift register means in response to an output of said decoder means.

8. A device according to claim 6 wherein said control latch means includes a read latch and a write latch for each of said plurality of bits.

* * * * *